(12) United States Patent
Janosevic et al.

(10) Patent No.: US 7,792,493 B2
(45) Date of Patent: Sep. 7, 2010

(54) TRANSMITTER AND A METHOD OF CALIBRATING POWER IN SIGNALS OUTPUT FROM A TRANSMITTER

(75) Inventors: Zoran Janosevic, Reading (GB); Stephen Frankland, Horsham (GB)

(73) Assignee: QUALCOMM, Incorporated, San Diego, CA (US)

( * ) Notice: Subject to any disclaimer, the term of this patent is extended or adjusted under 35 U.S.C. 154(b) by 0 days.

(21) Appl. No.: 10/529,521

(22) PCT Filed: Sep. 24, 2003

(86) PCT No.: PCT/GB03/04178

§ 371 (c)(1),
(2), (4) Date: Oct. 7, 2005

(87) PCT Pub. No.: WO2004/030246

PCT Pub. Date: Apr. 8, 2004

(65) Prior Publication Data

US 2006/0114075 A1 Jun. 1, 2006

(30) Foreign Application Priority Data

Sep. 26, 2002 (GB) ................................ 0222380.8

(51) Int. Cl.
*H04B 17/00* (2006.01)
(52) U.S. Cl. ................. 455/67.14; 455/115.1; 455/116; 455/127.1
(58) Field of Classification Search ............. 455/67.14, 455/115.1, 116, 127.1, 127.2, 127.3, 127.5, 455/522
See application file for complete search history.

(56) References Cited

U.S. PATENT DOCUMENTS 5,589,796 A 12/1996 Alberth, Jr. et al.

(Continued)

FOREIGN PATENT DOCUMENTS

EP 1093233 4/2001

(Continued)

OTHER PUBLICATIONS

Written Opinion - PCT/GB03/004178, IPEA - European Patent Office, Jul. 16, 2004.

*Primary Examiner*—Tuan H Nguyen
(74) *Attorney, Agent, or Firm*—Nicholas J. Pauley; William M. Hooks

(57) ABSTRACT

A transmitter circuit 10 with a first characteristic controllable by a first control signal and a second characteristic controllable by a second control signal is calibrated using a calibration method to enable accurate power control. The transmitter circuit 10 will typically comprise a VGA amplifier 16 and a power amplifier 22. Typically, the gain of the VGA amplifier 16 is controlled and so is the current supplied to the power amplifier 22. The method comprises a number of operations including defining a set of multiple signal values for the first control signal, setting the first control signal to a level corresponding to a signal value from the set of multiple first control signal values. Then the second control signal is adjusted to cause the transmitter to operate in a desired manner and the power in a signal transmitted by the transmitter is measured. The setting, adjusting and measuring is repeated for each signal value in the set of multiple first control signal values.

18 Claims, 8 Drawing Sheets

U.S. PATENT DOCUMENTS

| | | | |
|---|---|---|---|
| 5,752,172 A * | 5/1998 | Matero | 455/127.3 |
| 6,370,203 B1 | 4/2002 | Boesch et al. | |
| 6,374,116 B1 | 4/2002 | Hafiz et al. | |
| 6,463,264 B1 | 10/2002 | Obara | |
| 6,614,309 B1 * | 9/2003 | Pehlke | 330/296 |
| 2002/0021687 A1 * | 2/2002 | Toki et al. | 370/345 |
| 2004/0198261 A1 * | 10/2004 | Xiong | 455/115.1 |

FOREIGN PATENT DOCUMENTS

| | | |
|---|---|---|
| JP | 07-177045 | 7/1995 |
| JP | 08-032514 | 2/1996 |
| JP | 2000-252914 | 9/2000 |
| JP | 2001-156654 | 6/2001 |
| JP | 2002-094392 | 3/2002 |
| JP | 2002-176368 | 6/2002 |
| WO | 9960698 | 11/1999 |
| WO | WO 01/26259 A1 * | 4/2001 |
| WO | 0184741 | 11/2001 |
| WO | 0243240 | 5/2002 |

* cited by examiner

TRANSMITTER AND A METHOD OF CALIBRATING POWER IN SIGNALS OUTPUT FROM A TRANSMITTER

BACKGROUND OF THE INVENTION

I. Field of the Invention

The present invention relates generally to a transmitter and to a method of calibrating power in signals output from a transmitter. The invention is useful for controlling the current in a power amplifier in a mobile phone but is not limited to such an application.

II. Description of the Related Art

Until now the emphasis in handset transmitter design for cellular systems has focused on obtaining adequate linearity in the transmitter. The challenge of obtaining high efficiency has only very recently started to be examined. Existing handset designs therefore have very inefficient transmitters. Power control is a significant aspect of the design of cellular based mobile phone systems, particularly, but not exclusively, in systems based on the various CDMA standards that have been developed in recent years and continue to be developed.

Power amplifiers are used in mobile phones to control the power in signals transmitted by the mobile phones. Hitherto such power amplifiers have had either no means to control the bias conditions of the active devices, or some form of very crude means of doing so. Some power amplifiers have been designed to operate in one of two modes, namely a low current mode and a high current mode. The high-current mode is used to obtain adequate linearity at the highest required output powers, and the low-current mode is used to obtain adequate linearity at lower power levels with reduced supply current.

Control circuitry associated with the power amplifier is arranged to generate a control signal for switching the power amplifier between the two modes depending on the required output power. In these amplifier circuits the current control signal is a binary signal that switches operation of the power amplifier between low and high current modes. At lower levels the reduced current drawn from the battery compromises the linearity of the power amplifier. However, at lower output powers there is also less of a requirement for linearity, so the low current mode is used during operation at lower output powers. When the output power from the power amplifier exceeds a certain value (usually between 10 dBm and 20 dBm), the reduced linearity causes the performance to come close to specified limits.

In the case of WCDMA, the parameters of interest are the Adjacent Channel Leakage Ratio (ACLR) and the spectral emission mask. When these values exceed respective predetermined thresholds the power amplifier is switched over to the high current mode, where the linearity is improved at the expense of the higher current drawn from the battery.

While such an arrangement enables the power to be controlled, it does not minimize power consumption during a call. Minimizing power consumption is important in any mobile device because the amount of available battery energy is limited. Hitherto the current control signal has been arranged to change state when it is necessary for the power amplifier to change between the low and high current modes. The actual switching point is usually specified as a certain power amplifier output power. Operation of the power amplifier is at an optimum in terms of linearity, efficiency and power only at maximum power and at the point where the amplifier switches between the low and high current modes.

While the forgoing arrangement is adequate in that it enables accurate power control, it is less than satisfactory in that it does not minimize power consumption by the mobile phone during a call.

SUMMARY OF THE INVENTION

The invention addresses the above-discussed problems.

According to one aspect of the invention there is provided a method of calibrating a transmitter circuit having a first characteristic controllable by a first control signal and a second characteristic controllable by a second control signal, the method comprising: defining a set of multiple signal values for the first control signal; setting the first control signal to a level corresponding to a signal value from the set of multiple first control signal values; adjusting the second control signal to cause the transmitter to operate in a desired manner; measuring power in a signal transmitted by the transmitter while operating in the desired manner; and repeating the setting, adjusting and measuring for each signal value in the set of multiple first control signal values.

According to another aspect of the invention there is provided a method of calibrating a transmitter circuit having a first characteristic controllable by a first control signal and a second characteristic controllable by a second control signal, the method comprising: defining a set of multiple signal values for the first control signal; defining a set of multiple power values representing power in a signal transmitted by the transmitter; setting the first control signal to a level corresponding to a signal value from the set of multiple first control signal values; selecting a power value from the defined set of multiple power values; adjusting the second control signal to cause the transmitter to transmit a signal with a power corresponding to the selected power value; and repeating the selecting and adjusting for each power value in the set of multiple power values.

According to a further aspect of the invention there is provided a transmitter comprising: a receiver for receiving power data specifying a power value; an amplifier having a first characteristic controllable by a first control signal and a second characteristic controllable by a second control signal; a store for storing data representing power values, corresponding first control signal values and corresponding second control signal values; a controller coupled to the receiver and the store and responsive to the received power data for generating from the data stored in the store a first control signal for controlling the first characteristic and a second control signal for controlling the second characteristic.

One aim of the invention is to minimize the power supply current drawn by the power amplifier over the whole dynamic range of the transmitter. This enables battery life to be extended because the power consumed by the power amplifier will be limited to that necessary to transmit at the required transmit power level.

The method of dynamic control of power amplifier current to be described herein takes advantage of a continuous, or near-continuous, bias adjustment capability to optimize the operation in terms of linearity, efficiency and power over the whole dynamic range of the amplifier. Instead of the hitherto used digital control line and two modes of operation, the method uses a current-control input that has a multiplicity of states (alternatively, the amplifier may be responsive to a continuously adjustable analogue voltage). The multi-state input is used to set a specific amplifier bias condition for any specific output power level. It is thus possible to set an optimum supply current for any given output power, such that near-maximum efficiency is obtained with adequate linearity.

In the case of a CDMA system, linearity of the transmitter chain (in particular that of the power amplifier) determines the performance of the handset as measured by the previously mentioned two performance parameters, ACLR and spectral emission mask.

The above and further features of the invention are set forth with particularity in the appended claims and together with advantages thereof will become clearer from consideration of the following detailed description of an exemplary embodiment of the invention given with reference to the accompanying drawings.

DETAILED DESCRIPTION OF AN EMBODIMENT OF THE INVENTION

Figure 1:
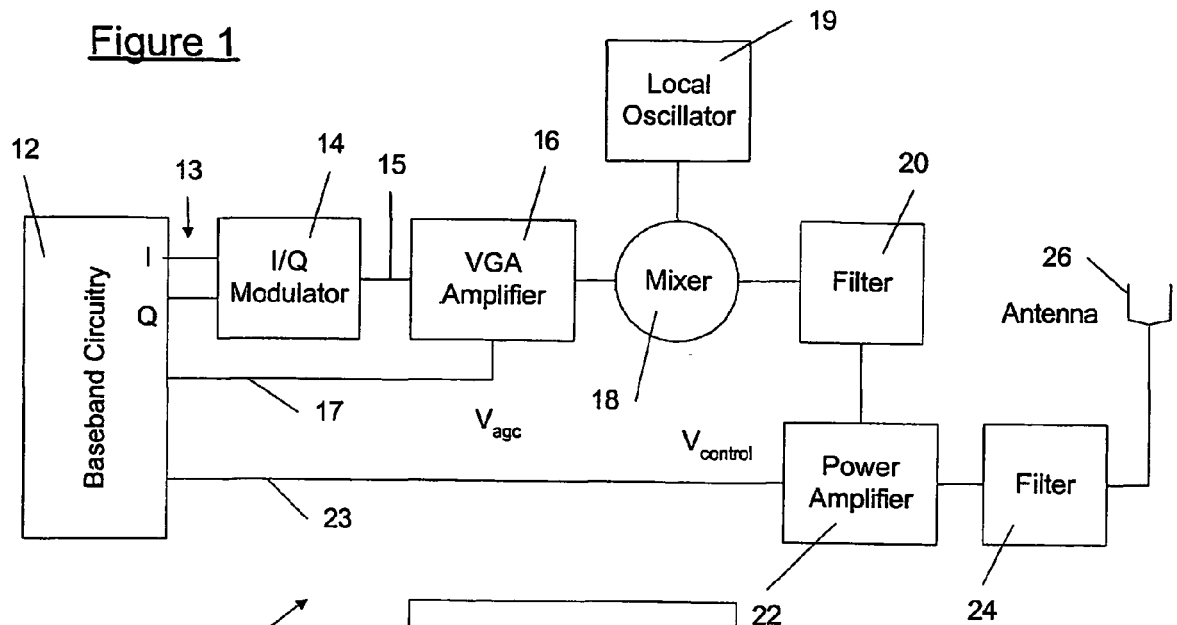
FIG. 1 is a is a schematic block diagram of a transmitter.

Turning now to FIG. 1 of the accompanying drawings there is shown a schematic block diagram of a transmitter 10. A transmitter such as the transmitter 10 illustrated in FIG. 1 would commonly be used to transmit CDMA signals (or WCDMA or other CDMA standards) but is not limited to the transmission of such signal. For example, the transmitter could be used in a cellular system employing a QPSK modulation scheme or other modulation schemes with non-constant signal envelope.

The transmitter 10 comprises baseband circuitry 12 that contains circuitry (not shown) that generates signals representing voice, data or other information to be transmitted and control circuitry (not shown) that generates control signals for controlling operation of elements of the transmitter. Among other things the baseband circuitry will contain a processor and associated memory for processing data and generating control signals for the rest of the transmitter. The baseband circuitry 12 also contains circuits for generating data (representing voice or information for example) for transmission. That data is converted into a suitable form for transmission. For example, the baseband circuitry may contain an arrangement such as is described in WO-A-9200639. In that arrangement, data is converted into a modulated (CDMA) signal having both an in-phase (I) and quadrature (Q) components which can be applied to a carrier signal for transmission.

In the transmitter 10 shown in FIG. 1, I and Q signals 13 containing information to be transmitted are output from the baseband circuitry 12 to an I/Q modulator 14 where they are modulated. The modulated signal 15 from the I/Q modulator 14 is input to a variable gain amplifier (VGA) 16, which also receives a gain control signal 17 from the baseband circuitry 12. The variable gain amplifier is provided to condition the modulated signal for subsequent stages by amplifying the signal to a substantially uniform size. The gain control signal 17 is typically an analogue voltage that is output from a digital to analog converter (DAC) (not shown) in the baseband circuitry 12. The gain-control signal 17 adjusts the gain in the transmitter 10.

Signals from the variable gain amplifier 16 are applied to a mixer 18 where they are mixed with signals generated by a local oscillator (LO) 19. Signals from the mixer 18 are filtered by a band pass filter 20 and then passed on to a power amplifier 22. The power amplifier 22 also receives a current control signal 23 from the baseband circuitry 12. The current control signal 23 adjusts the bias current in the power amplifier 22 depending on the power level required in the signal output therefrom. Signals output from the power amplifier 22 are filtered by a bandpass filter 24 before being output to an antenna 26 for transmission.

It will be appreciated by those possessed of the appropriate skills that although two separate amplifiers are shown in FIG. 1, it is possible to provide both the gain control and the current control functions in a single amplifier. Also, the VGA amplifier 16 may be placed after the mixer 18. Moreover, the power amplifier 22 may consist of two or more stages of amplification, for example a power amplifier driver followed by a power amplifier, in which case the PA driver could serve as the VGA and be controlled by the gain control signal. The transmitter arrangement illustrated in FIG. 1 has been chosen for its simplicity and its ability to facilitate understanding of the invention.

Similarly, will be appreciated that the gain control signal 17 (or a similar but separate gain control signal generated by the baseband circuitry 12) may also be input to the power amplifier 22 and that the current control signal 23 (or a similar but separate current control signal generated by the baseband circuitry 12) may also be input to the VGA 16. However for the purpose of simplicity of explanation these additional signals have been omitted from the drawing.

As has already been mentioned herein above, in previous transmitters the current control signal was a binary signal that enabled the power amplifier to change between low and high current modes depending on the required level of output power. Thus, in previous transmitters it was the gain control signal that provided most of the control over the power output from the transmitter, with the current control signal merely supplying a coarse control over the bias current applied to the power amplifier. In the transmitter circuit 10, the current control signal 17 is variable over a wide range of values, corresponding to setting the bias current at a value near to zero through to a maximum. Such a control signal enables optimum efficiency to be obtained over the whole dynamic range of the amplifier power. The current control signal 17 is a multi-state signal that may be a continuous analog signal or an N-bit digital signal.

Figure 2:
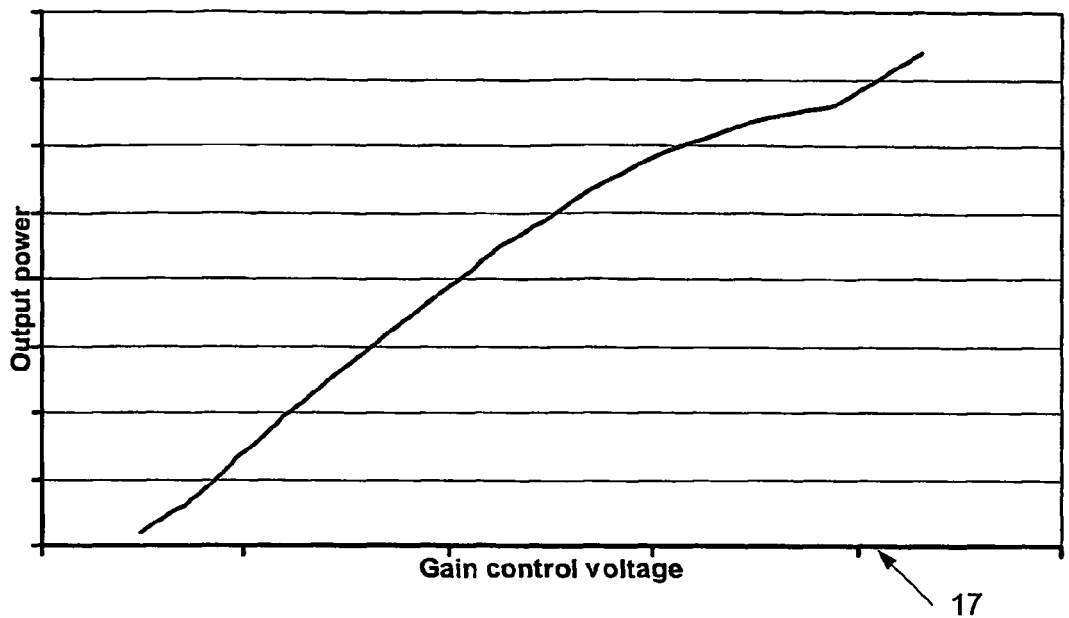
FIG. 2 is an example of a characteristic of a typical transmitter.

Turning briefly to FIG. 2 of the accompanying drawings, an example of a characteristic of the transmitter 10 is shown. The graph represents output power in the signal output to the antenna 26 for transmission against the gain control signal 17 for a given bias current condition, i.e. a given control current signal value. As can be seen in FIG. 2, the relationship between the output power at the antenna 26 and the gain control signal 17 is not linear. Component tolerances produce variations in parameters such as output power between different transmitters for any particular control voltage input.

The non-linear nature of the graph means that the characteristic cannot be easily represented as an equation. Therefore, in order to enable use of a multi-state current control signal 17, the non-linear power control characteristics of the transmitter need to be measured and stored. With this information the gain of the variable gain amplifier (VGA) 16 and the current of the power amplifier 22 can be set to achieve any output power within a desired dynamic range with optimum efficiency. The calibration procedure allows the determination of ideal values for both these control signals, for any required power level, by means of the use of a measurement technique and by the use of stored data in the form of one or more look-up tables or data arrays.

The measurement of the power control characteristic is done by way of a calibration procedure, which allows the mapping of the AGC and current-control signal values onto the required power values, such that both AGC signal and current-control signal can be set to optimum values for any required power level in order to obtain adequate performance with minimum supply current.

A procedure for measuring the transfer characteristic of the current control signal against output power will now be described. Data representing this characteristic is determined and stored first, before the gain control characteristic is measured. This is necessary because in the transmitter 17 the current needs to be set before setting the AGC in order to yield a prescribed ACLR (Adjacent Channel Leakage Ratio) performance with optimum or minimum supply current.

A voltage ($V_{agc}$) is used as the gain control signal 17 input to the VGA amplifier 16. Similarly, a voltage $V_{control}$ is used as the current control signal 23 input to the power amplifier 22. It should be noted that on presently available power amplifier devices, the current-control signal ($V_{control}$) is typically a simple bias input. What this means is that both the output power and the supply current vary according to both $V_{agc}$ and $V_{control}$. This is simply because the input RF signal to the output device contributes towards the DC bias of that device, through the process of 'self-biasing'. Therefore, the approach, when a new power level is required, is to fix the $V_{control}$ signal to a pre-defined value for that power level, and adjust the $V_{agc}$ signal to produce the required linearity for that value of $V_{control}$. The calibration process allows the definition of a pre-defined value of $V_{control}$ for each power level, and either look-up or calculation of the required $V_{agc}$ for that power level.

Figure 3:
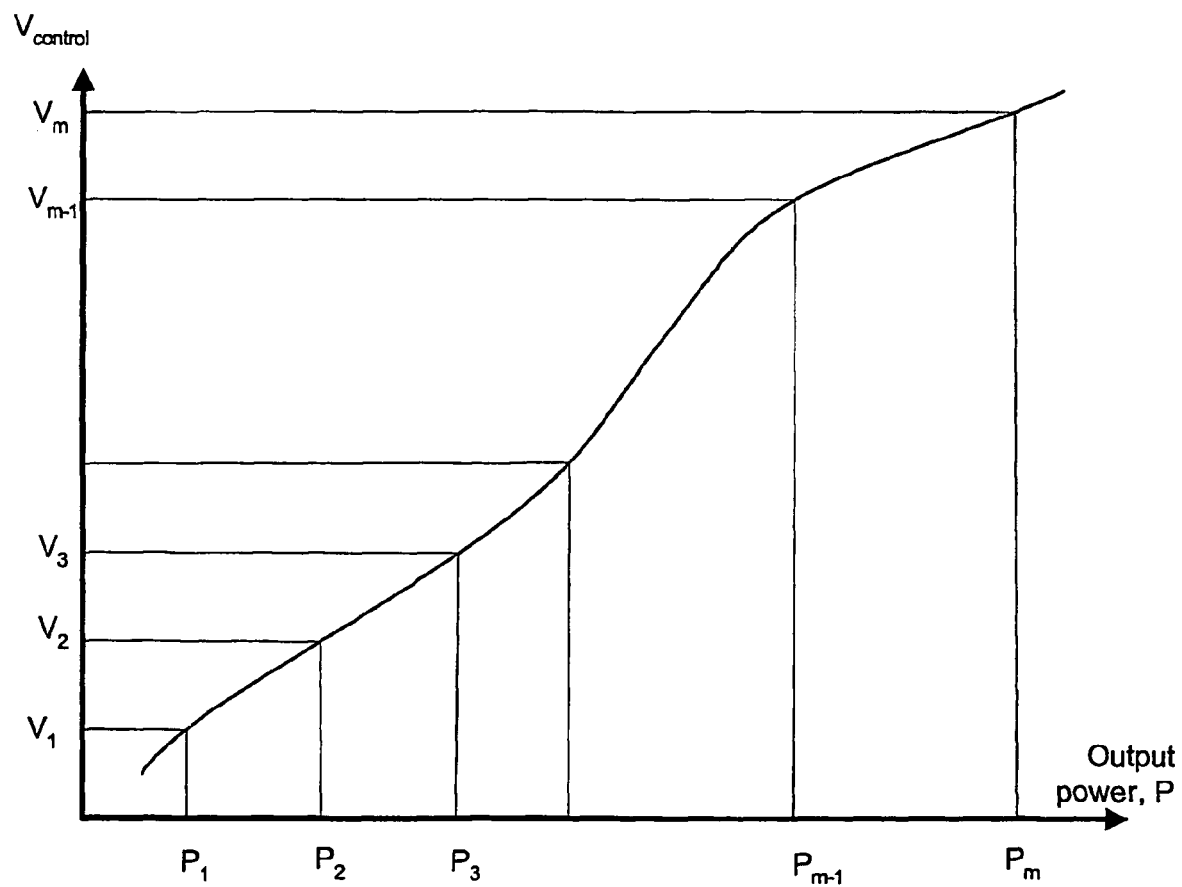
FIG. 3 example of another characteristic of an amplifier in the transmitter.

FIG. 3 of the accompanying drawings shows one example of a characteristic of the amplifier in terms of $V_{control}$ against output power (P) for a given ACLR. The dynamic range of the current control signal $V_{control}$ is determined by this characteristic. At one end of the dynamic range the minimum voltage, $V_{control}(1)$ should be no greater than that specified for the power amplifier as the threshold voltage below which the power amplifier is considered switched off. At the other end, the maximum voltage, $V_{control}(n)$, should be no less than a value where the maximum specified power is produced from the phone with slightly less than optimum efficiency. That is, $V_{control}(n)$ should have a sufficiently high value to allow efficient operation of the power amplifier up to the highest required power under the predicted operating conditions.

Measurements of $V_{control}$ are taken across the whole dynamic range with appropriate spacing between adjacent values of $V_{control}$. As an example, the spacing between any adjacent voltage values might be 50 millivolts. As another example, the spacing between values might vary according to a known typical power amplifier characteristic, to give convenient intervals of power.

Figure 4:
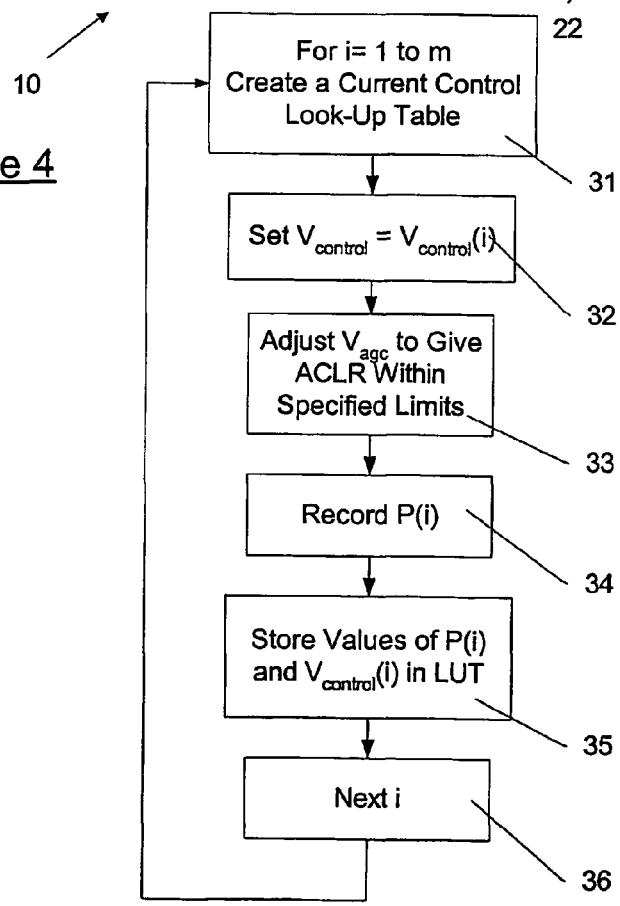
FIG. 4 represents a procedure for measuring values of the characteristic of FIG. 3.

FIG. 4 of the accompanying drawings represents a procedure for measuring values of the characteristic of FIG. 3. The procedure begins in box 31 with an integer value i set to zero and is repeated for all values of i up to i=m. On the first pass through the procedure, therefore, the voltage of the current control signal is set to the value C in box 32. Next, in box 33, the voltage of the gain control signal is adjusted until the ACLR reaches a set threshold (for example 3 dB within specification). The output power P(1) is recorded at box 34 and values of $V_{control}(1)$ and P(1) are then stored in a table at box 35. The value of i is incremented at box 36 and the procedure is then repeated with the value of the current control signal ($V_{control}(1)$ set to $V_{control}(1)$, and again until values of P have been stored against all values from i=1 to m of $V_{control}(i)$. The end result of this measurement procedure is a table that represents the characteristic of current control voltage against output power (as shown in FIG. 3). Typically the results will be stored as a look-up table ("the current control look-up table") for to enable fast access to the data in subsequent stages.

Figure 5:
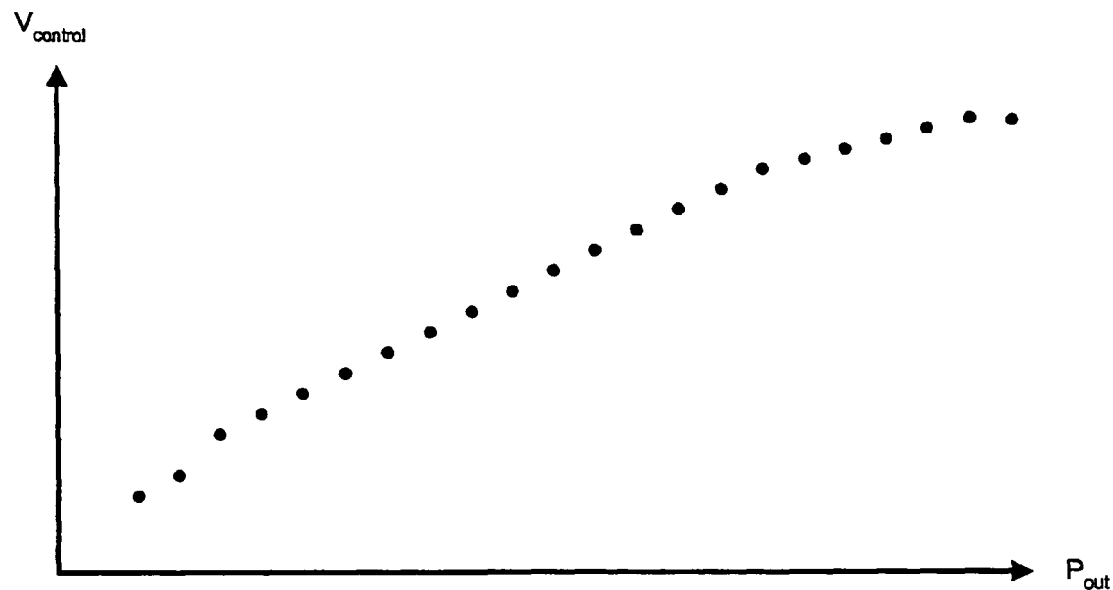
FIG. 5 is a graph showing a set of discrete voltage values against a set of discrete output power values.

FIG. 5 is a graph that shows what a typical set of results stored in the current control look-up table could look like if plotted in graphical form; a set of discrete voltage values against a set of discrete output power values. The current control look-up table is used to calculate an appropriate value of current control voltage $V_{control}$ for any required value of output power P. There are a number of ways in which the data from the current control look-up table can be used by the baseband circuitry to calculate the linear version of the transfer characteristic from the discrete values thus determined.

Figure 6:
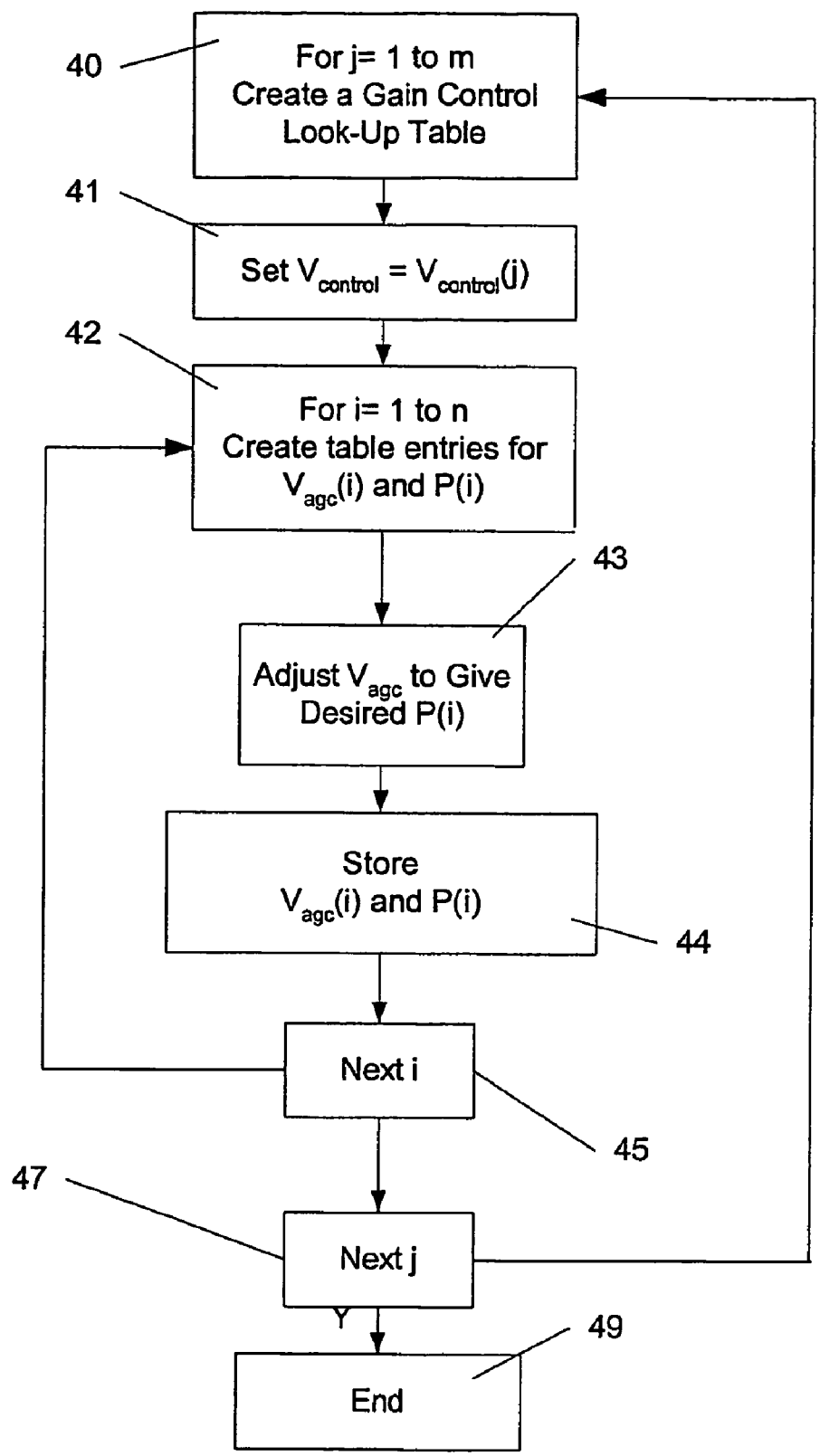
FIG. 6 is a procedural flow diagram showing a process of measuring the gain control characteristic where several look-up tables are to be used.

One way is to assume that the voltage between any adjacent output power values P(i) and P(i+1) is constant. If this assumption is made, then the linear transfer characteristic can be determined using several look-up tables, one for each of several different supply current settings, or by using one look-up table and measuring only one gain control characteristic. FIG. 6 is a procedural flow diagram showing a process of measuring the gain control characteristic where several look-up tables are to be used. In the process shown in FIG. 6 the procedure of measuring the gain control characteristic is repeated for every voltage level $V_{control}(1)$ to $V_{control}(m)$, that is stored in the current control look-up table. In this way m+1 look-up tables ("gain control look-up tables") are produced, one for every value of $V_{control}$.

Referring now to FIG. 6, in block 40 values of j are defined from 1 to m, and in block 41 $V_{control}$ is set to the jth value. Thus, the procedure is repeated for m+1 different values of $V_{control}$, i.e. m+1 different bias current settings. In block 42 values of i are defined from 1 to n. The value n in this procedure need not be the same as the value n in the procedure described herein above with reference to FIG. 4. In block 43 the gain control signal $V_{agc}$ is adjusted to give an output signal with a power equal to the desired power output P(i). The values of $V_{agc}(i)$ and P(i) are then stored as represented by block 44.

In block 45 the next value of i is selected and the operations represented by blocks 43 and 44 are repeated, until i=n, to give for the setting of $V_{control}(j)$ a value of $V_{agc}$ and P for each value of i=1 to n. When i=n in block 45, the jth gain control look-up table is complete. In block 47 the value of j is incremented. Blocks 41 to 46 are then repeated and this continues for all values of m. In this way, for all m+1 values of $V_{control}$ a corresponding set of values for $V_{agc}(i)$ and P(i) are stored.

Each gain control look-up table will of itself be relatively small because each look-up table will only include a relatively small range of values of $V_{agc}(i)$ and $P(i)$ for a specific value of $V_{control}(j)$. The range is chosen to ensure that the ACLR threshold can be met for that $V_{control}(j)$ based on previously determined power amplifier characteristics. This is one method of calibrating $V_{control}$ and $V_{agc}$ against required power (P). Another method will be described below.

Storing the current control look-up table and the gain control look-up tables in a mobile phone enables the values to be used in control of the power in the signal transmitted by the phone. In a cellular system the power in a signal transmitted by a mobile phone is typically controlled in two ways. Firstly, the phone looks at changes the strength of signals that it is receiving and adjusts its output in the opposite direction. This is known as "open loop" power control. Secondly, the phone receives control or command signals from a base station based on the strength of signals actually received at the base station from the mobile phone. If the signals are weak then the command will result in an increase the power in signals transmitted from the phone, and if the signals are strong the command will result in a decrease in power. This is known as "closed loop" power control. Both forms of power control are described in U.S. Pat. No. 5,056,109 and elsewhere and need not be described further herein.

Figure 7:
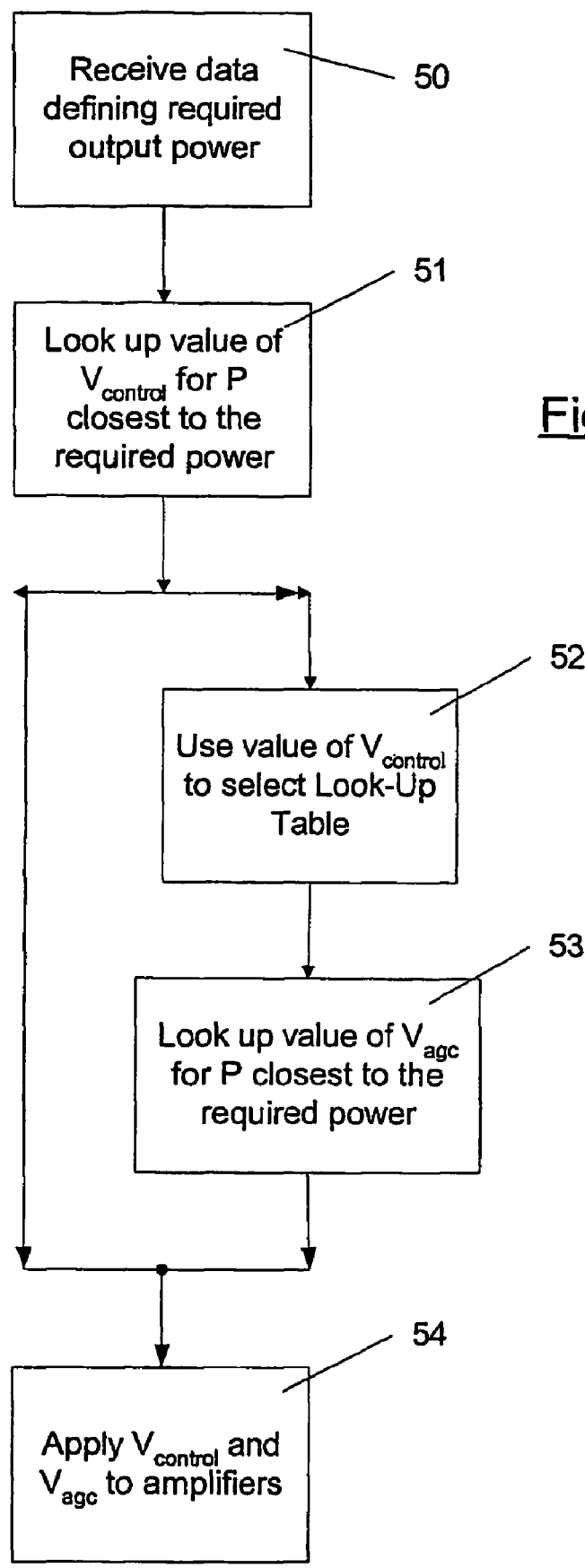
FIG. 7 illustrates how a required output power value is compared with the data in look-up tables created by the procedure shown in FIG. 6.

FIG. 7 of the accompanying drawings illustrates how during a "closed loop" call, the required output power is compared with the data in the look-up tables and with this data the baseband circuitry 12 (see FIG. 1) sets the appropriate vales of $V_{agc}$ on line 17 and $V_{control}$ on line 23. In block 50 the mobile phone receives data defining the output power (P) that the transmitter is required to output. In block 51 that P data is used to look-up a value for $V_{control}$ in the current control look-up table. Depending on the resolution of the look-up table, the stored values of P may not correspond exactly with the required value specified by the received data. In this case the closest stored value of P that is higher than required P will be selected to give a value of $V_{control}$. Once the value for $V_{control}$ has been determined, it is used to select the appropriate gain control look-up table, as represented by block 52. Then, as shown in block 53, the received power data is again used, this time to identify a value for $V_{agc}$ that will give an output power closest to and above the required output power. In this way values of $V_{control}$ and $V_{agc}$ are determined. In block 54 those values are applied to the Power amplifier 22 and the VGA amplifier 16 by the baseband circuitry 12 (see FIG. 1).

Thus, multi-state inputs are used to set a specific amplifier bias condition for any specific output power level. It is thus possible to set an optimum supply current for any given output power, such that near-maximum efficiency is obtained with adequate linearity. In the case of a CDMA system, linearity of the transmitter circuitry, such as that shown in FIG. 1 (in particular that of the power amplifier) determines the performance of the handset as measured by the previously mentioned two performance parameters ACLR and spectral emission mask.

The procedure shown in FIG. 7 is efficient in terms of microprocessor power, because it does not use complicated algorithms for calculations. However, it is inefficient in that it requires a lot of memory space to store the current control look-up table and the several (m+1) gain control look-up tables. An alternative approach is to use only one look-up table for the gain control characteristic. Data for this alternative is obtained by setting the current control voltage $V_{control}$ to the appropriate discrete voltage levels and measuring gain control voltage vs. power data pairs ($V_{agc}(i)$, $P(i)$) that are stored in the current control look-up table. As the gain control voltage is stepped up in order to measure the whole dynamic range, the current control is stepped up accordingly.

The calibration method for this alternative will now be described in greater detail with reference to the procedure shown in FIG. 8 of the accompanying drawings. The procedure relies on data from the current control look-up table. Therefore, before the procedure can begin, the current control look-up table must be created, using the procedure illustrated in FIG. 4 for example. This is represented by block 60 in FIG. 8. Note that in block 60 values of $V_{control}(j)$ are stored against values of $P(j)$. The procedure for creating the gain control look-up table begins at block 61 and involves an integer number i of repetitions of the same sequence of steps. The integer i need not be the same as the integer j in block 60. Consequently, for a given value of desired output power P there may not be an exactly matching entry in the current control look-up table.

In block 62 the value of $V_{control}(j)$ required to give the desired output power $P(i)$ is determined from the current control look-up table. The value of $V_{control}(j)$ is determined by identifying adjacent values of output power, i.e. $P(j)$ and $P(j+1)$ between which the desired value $P(i)$ lies and taking the value of $V_{control}$ for the higher of the two power values thus identified. Put another way, the value of $P(j)$ closest to and above the desired value $P(i)$ is used to determine the appropriate value for $V_{control}(j)$. In block 63 a voltage $V_{control}$ corresponding to the value $V_{control}(j)$ is applied to the power amplifier 22 (see FIG. 1). The higher value is chosen because this ensures that the ACLR margin is at least the specified minimum.

The transmitter circuit is now set up to enable the voltage $V_{agc}$ applied to the VGA amplifier 16 (see FIG. 1) to be adjusted until the power in the signal output from the transmitter is equal to $P(i)$. This is represented by block 64 in FIG. 8. Once this has been achieved, a value $V_{agc}(i)$ corresponding to the applied voltage $V_{agc}$ is stored against $P(i)$ in the gain control look-up table, is shown in block 65. The value of i is incremented in block 66 and the operations represented by blocks 61 to 65 are repeated for all n values of i.

Figure 9:
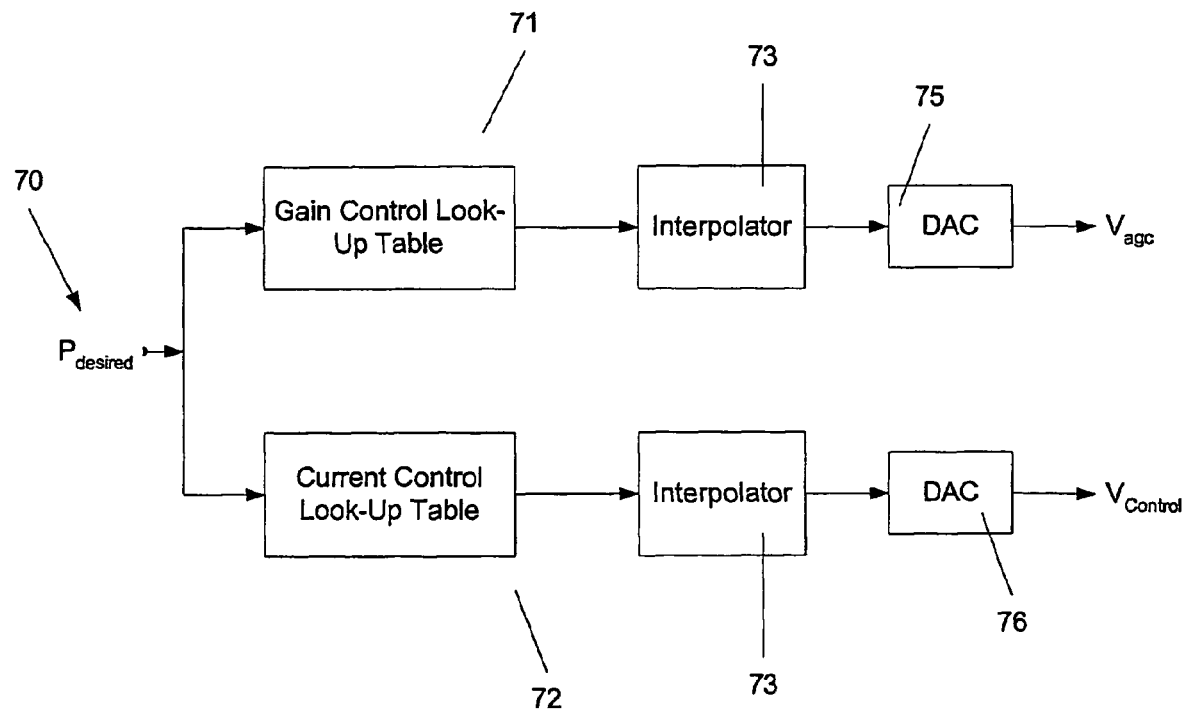
FIG. 9 illustrates how a required output power value is compared with the data in look-up tables created by the procedure shown in FIG. 8.

FIG. 9 of the accompanying drawings illustrates how during a "closed loop" call, the required output power is compared with the data in the look-up tables and with this data the baseband circuitry 12 (see FIG. 1) sets the appropriate vales of $V_{agc}$ on line 17 and $V_{control}$ on line 23. Data ($P_{desired}$) 70 is applied as the input to both the gain control look-up table 71 and the current control look-up table 72. The two look-up tables 71, 72 respond by outputting values for $V_{agc}$ and $V_{control}$ respectively. There may not be an exact value of power P in the look-up tables to that of the desired power. Instead, the value of $P_{desired}$ will lie between two adjacent values of $P(i)$ in the look-up tables. Both look-up tables are therefore arranged to output two values of $V_{agc}$ and $V_{control}$ corresponding to the adjacent values of $P(i)$.

The two values output from the look-up tables 71, 72 are input to respective interpolators 73, 74 which calculate actual values of $V_{agc}$ and $V_{control}$ therefrom. The calculated values $V_{agc}$ and $V_{control}$ from the interpolators 73, 74 are input to associated digital to analog converters (DACs) 75, 76 which are also provided in the baseband circuitry of FIG. 1 and convert the values into corresponding voltages $V_{agc}$ and $V_{control}$, respectively are applied to the VGA amplifier 16 and the power amplifier 22 of FIG. 1.

Figure 8:
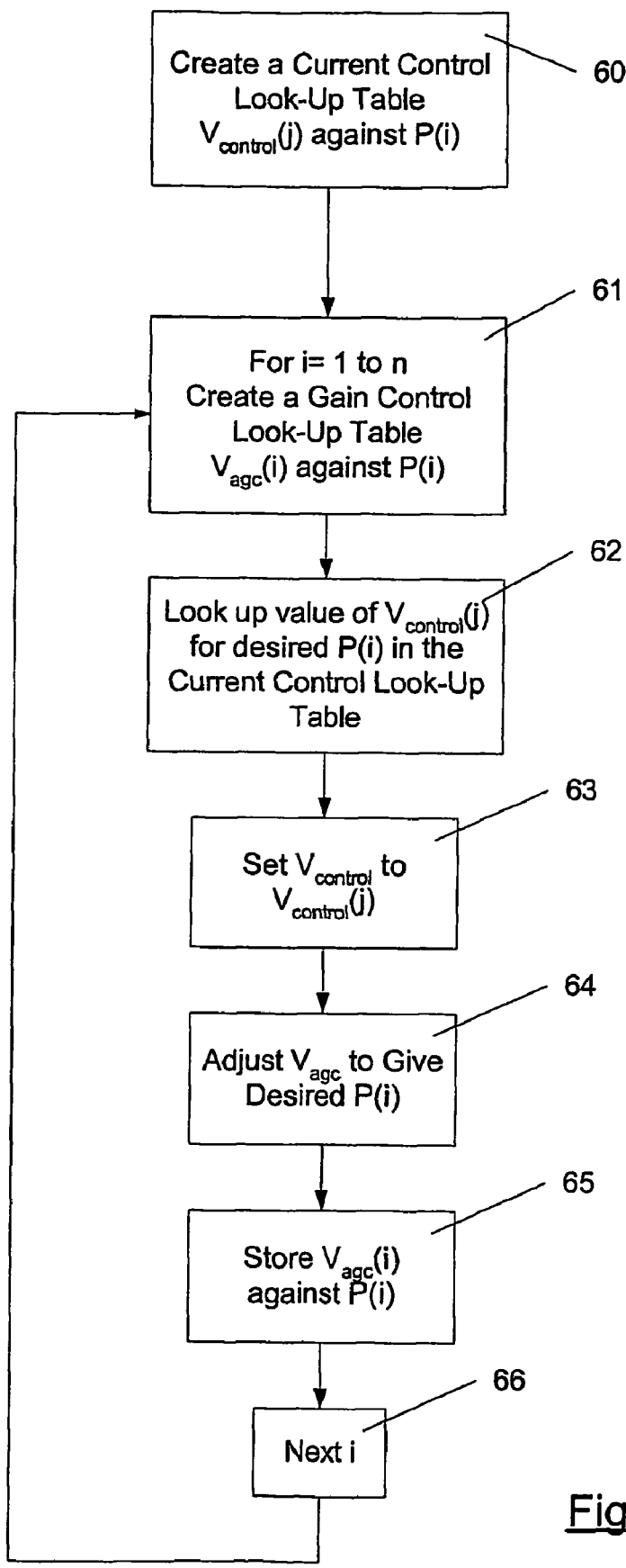
FIG. 8 shows an alternative calibration method.

The method illustrated in FIG. 8 is less demanding of memory because it requires only two look-up tables. It is, however, less accurate and it is possible that the values stored in the two look-up tables could cause a discontinuity in the output power when the current control voltage changes from $V_{control}(j)$ to $V_{control}(j+1)$, as the gain control voltage is gradually stepped up. This is because the current control voltage changes the gain of the power amplifier as well as the bias current applied to it. So a step change of the current control voltage will produce a step change in power, which slightly deviates (depending on the resolution of the current control steps) from the linearised gain control characteristic. Careful selection of values of i and j in the FIG. 8 procedure will avoid significant discontinuities and thus any problems that might be associated with such changes.

The methods and procedures so far described rely on the assumption that the voltage between any adjacent output power values P(j) and P(j+1) is constant, i.e. the voltage changes in a stepwise manner. Another way of calculating the control characteristics from the discrete values is to assume that for every adjacent pairs of points V(j), P(j) and V(j+1), P(j+1) the characteristic is linear, i.e. changes continuously between adjacent points. Using this assumption only two look-up tables are required: one look-up table for values of $V_{agc}$ against desired power; and one look-up table for $V_{control}$ against desired power. This approach also causes power discontinuities to be minimized as should become clear from the following description.

Figure 10:
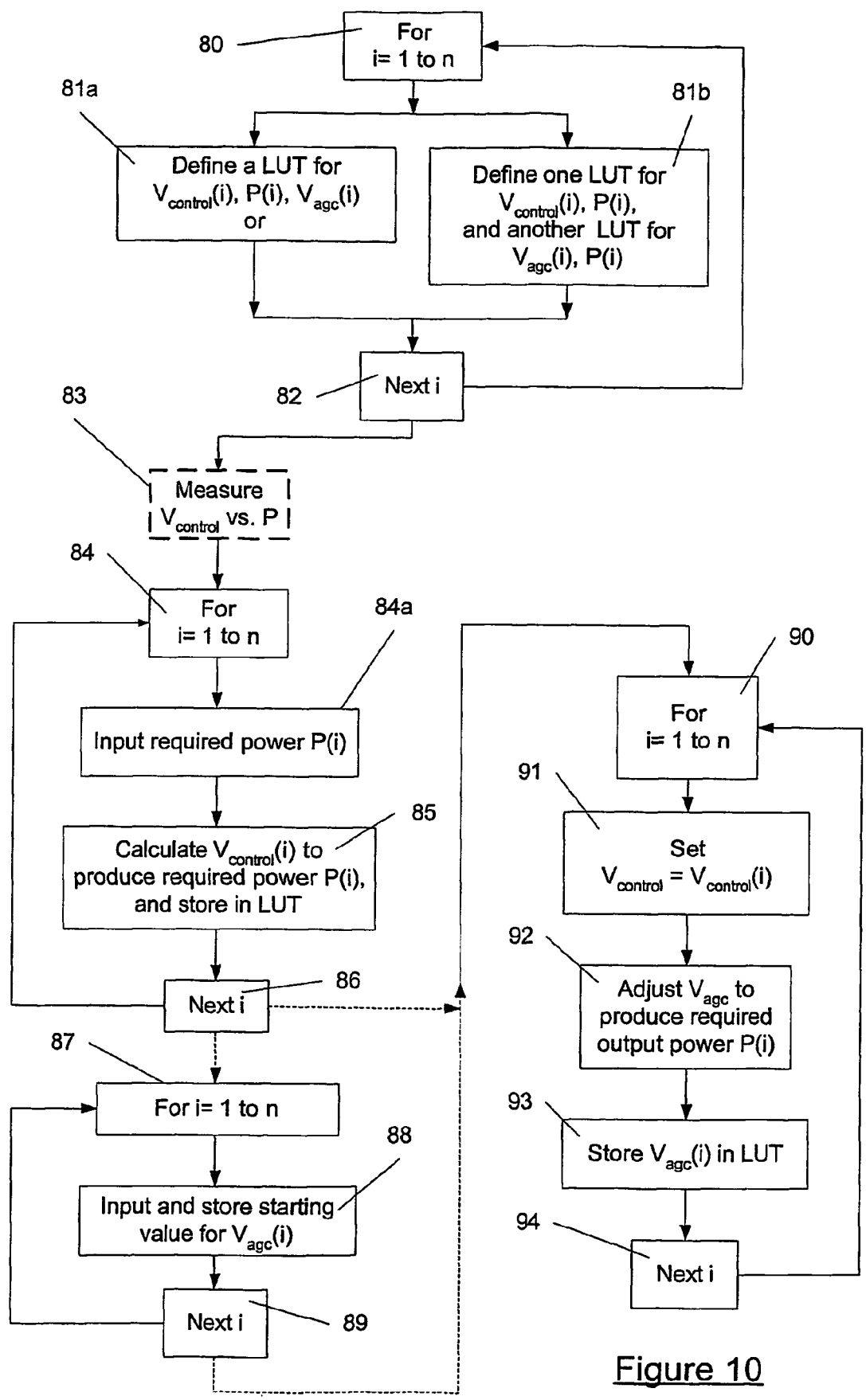
FIG. 10 is a block diagram illustrating another calibration procedure.

FIG. 10 of the accompanying drawings is a block diagram illustrating a suitable calibration procedure to obtain data for use under this assumption. The calibration procedure comprises four operations. One, a look-up table is defined. Two, values of $V_{control}$ are stored in the defined look-up table. Three, starting values of $V_{agc}$ are generated and stored in the defined look-up table. This step is optional, although it does facilitate subsequent processing of the data. Four, new optimum values of $V_{agc}$ are generated and stored in the defined look-up table. Block 80 represents the beginning of the operation to define a look-up table. A single look-up table (LUT) may be defined for all i values from 1 to n of $V_{control}(i)$, P(i) and $V_{agc}(i)$, as represented by block 81a, or alternatively, two separate look-up tables may be defined for all i values from 1 to n of $V_{control}(i)$ and P(i), and $V_{agc}(i)$ and P(i), as represented by block 81b. The look-up tables are defined once i has reached the value of n at block 82.

At this stage, or indeed even before the look-up tables have been defined, the control voltage ($V_{control}$) and power (P) characteristics (see FIGS. 3 and 4) are measured in block 83.

The procedure then moves on to the operation that results in starting values of $V_{agc}$ being generated and stored in the defined look-up table(s). The operation begins at block 84 and again repeats for each value of i from 1 to n. In block 84a the ith value of required power, i.e. P(i) is input and in block 85 a value of $V_{control}(i)$ is determined by looking up in the current control look-up table values of $V_{control}(j)$ and $V_{control}(j+1)$ stored against two values of P(j) and P(j+1) adjacent to the desired value of P(i). This is similar to the approach previously described with reference to FIG. 9. However, instead of simply taking the lowest of the two $V_{control}$ values, i.e. $V_{control}(j)$ as was previously the case, both values $V_{control}(j)$ and $V_{control}(j+1)$ are used to determine a value for $V_{control}(i)$. A value for $V_{control}(i)$ is calculated by interpolation between or extrapolation from the values $V_{control}(j)$ and $V_{control}(j+1)$. The value of $V_{control}(i)$ is then stored in the look-up table(s) created in block 81a or 81b. The procedure is repeated for all values of i from 1 to n, as determined at block 86.

On exit from block 86 the procedure may, optionally, continue at block 87 where an operation begins that results in starting values of $V_{agc}$ being generated and stored in the look-up table defined at block 81a or 81b for every value of i from 1 to n. A starting value for $V_{agc}(i)$ can readily be obtained from previously determined power amplifier characteristics. This procedure is similarly repeated for all values of i from 1 to n, as determined at block 89. An advantage of executing this optional procedure is that it saves time in deriving the optimum values of $V_{agc}$.

Alternatively, on exit from block 86 the procedure may continue at block 90 to the generation of optimum values of $V_{agc}$. In this procedure, again for all values of i from 1 to n, the voltage $V_{control}$ applied to the power amplifier 22 of FIG. 1 is set at a level corresponding to the value $V_{control}(i)$, as represented by block 91. Then, as shown in block 92, the voltage $V_{agc}$ applied to the VGA amplifier 16 of FIG. 1 is adjusted until the required Adjacent Channel Leakage Ratio (ACLR) linearity is achieved. This adjustment can be effected more efficiently if the initial voltage $V_{agc}$ applied to the VGA amplifier 16 is close to what it should be. Starting from an arbitrary voltage (e.g. 0 volts) results in a longer time being taken to get to the required value. That is why the storing of initial values for $V_{agc}(i)$ is optional. The value of $V_{agc}(i)$ is stored as represented by block 93, and the procedure is likewise repeated for all values of i from 1 to n, as determined at block 94.

The look-up table(s) thus created is used in a similar manner to that already described with reference to FIG. 7 to control the amplifiers in the transmitter circuit when the transmitter is in a "closed loop" call. From the data stored in the look-up tables the baseband circuitry 12 extrapolates the correct values for both voltages $V_{control}$ and $V_{agc}$. The current control voltage $V_{control}$ is set first and then the gain control voltage $V_{agc}$.

This method produces minimal discontinuities in output power because the current control characteristic is smooth and both control signals $V_{control}$ and $V_{agc}$ are adjusted simultaneously for each new power level. The method also requires only two look-up tables, which reduces hardware overheads but it may require more processor power because of the extra computation involved.

The foregoing method assumes that matching power values are required for the $V_{agc}$ and the $V_{control}$ look-up tables. It is however possible to effect a trade off between power control accuracy and memory (look-up tables) overheads by omitting the look-up table for $V_{control}$ against power. The measurements of $V_{control}$ against P obtained by the procedure of FIG. 4 can instead be used together with interpolation to obtain reasonably accurate values for $V_{agc}$ and $V_{control}$.

Figure 11:
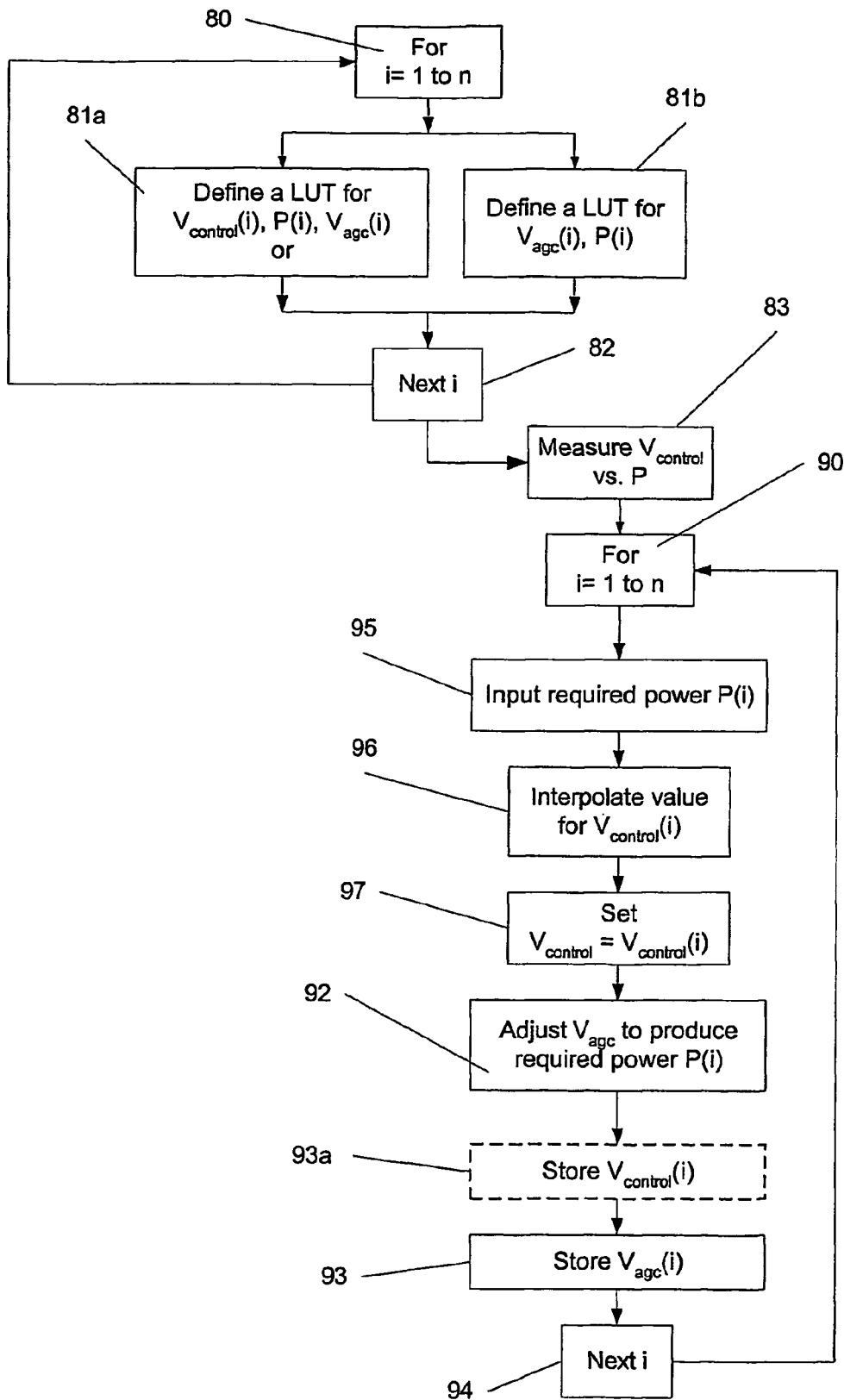
FIG. 11 is a block diagram of a streamlined version of the calibration procedure set out in FIG. 10.

FIG. 11 of the accompanying drawings shows a streamlined version of the calibration procedure set out in FIG. 10. In this version of the procedure blocks 80 to 83 remain, although block 81b is simplified by only defining a look-up table for $V_{agc}$ (and not for $V_{control}$). Blocks 84 to 89 are omitted, so that once the measurement of $V_{control}$ vs. P (as per FIG. 4) is complete the procedure continues at block 90. For each value of i=1 to n the required power P(i) is input to enable values to be read from the look-up table. This is represented by block 95 in FIG. 11.

As has been explained previously (with reference to FIG. 9 in relation to P(i) and $P_{desired}$) there may not be an exact value of P in the look-up table corresponding to that of the required power P(i) and, consequently, the value of P(i) will lie between two adjacent values of P in the look-up table. The look-up table therefore outputs two adjacent values for $V_{control}$ which are interpolated in block 96 to give a single value for $V_{control}$. In block 97 the voltage $V_{control}$ applied to the power amplifier 22 is set equal to the value output from the look-up table, and in block 92 (corresponding to block 92 in FIG. 10) the voltage $V_{agc}$ applied to the VGA amplifier is adjusted, thus causing the transmitter to transmit a signal at the required power. The value of $V_{agc}(i)$ is stored (as it was in FIG. 10) and optionally and additionally the value of $V_{control}(i)$ is stored in block 93a. The procedure is repeated for all values of i from 1 to n, as determined at block 94.

Having thus described the invention by reference to a preferred embodiment it is to be well understood that the embodiment in question is exemplary only and that modifications and variations such as will occur to those possessed of appropriate knowledge and skills may be made without departure from the spirit and scope of the invention as set forth in the appended claims and equivalents thereof.

The invention claimed is:

1. A method of calibrating a transmitter circuit having a first characteristic controllable by a first control signal and a second characteristic controllable by a second control signal, the method comprising:
   defining a set of multiple signal values for the first control signal;
   defining a set of multiple power values representing power in a signal transmitted by the transmitter;
   setting the first control signal to a level corresponding to a signal value from the set of multiple first control signal values;
   selecting a power value from the defined set of multiple power values;
   adjusting the second control signal to cause the transmitter to transmit a signal with a power corresponding to the selected power value;
   repeating the selecting and adjusting for each power value in the set of multiple power values; and
   minimizing a power supply current drawn by an amplifier over a dynamic range of the transmitter through at least a one of defining of a set of multiple signal values, defining of a set of multiple power values, setting of the first control signal, selecting and adjusting.

2. A method as claimed in claim 1, further comprising recording data representing the second control signal against the power in the transmitted signal.

3. A method as claimed in claim 1 or 2, further comprising repeating the setting, adjusting, selecting and repeating for each signal value from the set of multiple first control signal values.

4. A method as claimed in claim 2, further comprising repeating the setting, adjusting, selecting and repeating for each signal value from the set of multiple first control signal values, and recording the data representing the second control signal and the power in the transmitted signal against the signal value from the set of multiple first control signal values.

5. A method as claimed in claim 2, further comprising repeating the setting, adjusting, selecting and repeating for each signal value from the set of multiple first control signal values, wherein the data representing the second control signal and the power in the transmitted signal is stored in a separate list for each signal value from the set of multiple first control signal values.

6. A method as claimed in claim 5, wherein the data in each separate list is recorded as entries in a respective look-up table.

7. A method as claimed in claim 1 or 2, wherein the set of multiple signal values for the first control signal is defined by using previously created data representing transmitted signal power values against first control signal values.

8. A method as claimed in claim 7, wherein the previously created data is used by selecting a power value from the defined set of multiple power values and calculating a signal value for the first control signal.

9. A method as claimed in claim 7, wherein the previously created data is created using a method of calibrating a transmitter circuit having a first characteristic controllable by a first control signal and a second characteristic controllable by a second control signal, the method comprising:
   defining a set of multiple signal values for the first control signal;
   setting the first control signal to a level corresponding to a signal value from the set of multiple first control signal values;
   adjusting the second control signal to cause the transmitter to operate in a desired manner;
   measuring power in a signal transmitted by the transmitter while operating in the desired manner; and
   repeating the setting, adjusting and measuring for each signal value in the set of multiple first control signal values,
   wherein the second control signal comprises a gain control signal.

10. A method as claimed in claim 9, further comprising:
    storing a set of staffing values for the second control signal; and
    using the set of staffing values when adjusting the second control signal to cause the transmitter to transmit a signal with a power corresponding to the selected power value.

11. A method as claimed in claim 1 or 2, wherein the transmitter circuit comprises a first amplifier and a second amplifier, and the first characteristic is a characteristic of the first amplifier and the second characteristic is a characteristic of the second amplifier.

12. A method as claimed in claim 11, wherein the first amplifier comprises a power amplifier and the characteristic controlled by the first control signal comprises supply current to the power amplifier.

13. A method as claimed in claim 11, wherein the second amplifier comprises a conditioning amplifier, and the characteristic controlled by the second control signal comprises the gain of the conditioning amplifier.

14. A transmitter comprising:
    a receiver for receiving power data specifying a power value;
    an amplifier having a first characteristic controllable by a first control signal and a second characteristic controllable by a second control signal wherein the amplifier comprises a first amplifier and a second amplifier, and the first characteristic is a characteristic of the first amplifier and the second characteristic is a characteristic of the second amplifier;
    a store for storing data representing power values, corresponding first control signal values and corresponding second control signal values wherein the store comprises a look-up table;
    a controller coupled to the receiver and the store and responsive to the received power data for generating from the data stored in the store a first control signal for controlling the first characteristic and a second control signal for controlling the second characteristic, wherein the first control signal comprises a current control signal wherein;
    the controller comprises an analog-to-digital converter coupled to the amplifiers;
    the controller is arranged to apply the received power data to the look-up table;
    the look-up table is arranged to respond to the application of received power data by supplying data to the analog-to-digital converter; and the analog-to-digital converter is arranged to respond to the supplied data by outputting the first control signal to the first amplifier and the second control signal to the second amplifier.

15. A transmitter as claimed in claim 14, wherein the controller is arranged to output the first control signal values and the second control signal values directly to the analog-to-digital converter.

16. A transmitter as claimed in claim 14 or 15, wherein the controller comprises a processor for:
  processing data from the store to produce data defining the first control signal and the second control signal; and
  outputting the same to the analog-to-digital converter.

17. A transmitter as claimed in any of claims 14, or 15, wherein the data in the store is generated using a method of calibrating a transmitter circuit having a first characteristic controllable by a first control signal and a second characteristic controllable by a second control signal, the method comprising:
  defining a set of multiple signal values for the first control signal;
  defining a set of multiple power values representing power in a signal transmitted by the transmitter;
  setting the first control signal to a level corresponding to a signal value from the set of multiple first control signal values;
  selecting a power value from the defined set of multiple power values;
  adjusting the second control signal to cause the transmitter to transmit a signal with a power corresponding to the selected power value; and
  repeating the selecting and adjusting for each power value in the set of multiple power values,
  wherein at least one of the defining of the set of multiple signal values, defining of the set of multiple power values, setting of the first control signal, selecting of the power value, adjusting of the second control signal, and repeating of the selecting and adjusting minimizes a power supply current drawn by an amplifier over a dynamic range of the transmitter.

18. A method of calibrating a transmitter circuit having a first characteristic controllable by a first control signal and a second characteristic controllable by a second control signal, the method comprising:
  means for defining a set of multiple signal values for the first control signal;
  means for defining a set of multiple power values representing power in a signal transmitted by the transmitter;
  means for setting the first control signal to a level corresponding to a signal value from the set of multiple first control signal values;
  means for selecting a power value from the defined set of multiple power values;
  means for adjusting the second control signal to cause the transmitter to transmit a signal with a power corresponding to the selected power value;
  means for repeating the selecting and adjusting for each power value in the set of multiple power values; and
  means for minimizing a power supply current drawn by an amplifier over a dynamic range of the transmitter through at least one of the defining of a set of multiple signal values, defining of a set of multiple power values, setting of the first control signal, selecting of the power value, adjusting of the second control signal, and repeating of the selecting and adjusting.

* * * * *